United States Patent
Lee et al.

(10) Patent No.: US 9,673,342 B2
(45) Date of Patent: *Jun. 6, 2017

(54) TEXTURED SILICON SUBSTRATE AND METHOD

(71) Applicant: THE CHEMOURS COMPANY FC LLC, Wilmington, DE (US)

(72) Inventors: Seung Jin Lee, Kyunggi-Do (KR); Hee Soo Yeo, Ulsan (KR)

(73) Assignee: THE CHEMOURS COMPANY FC, LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/599,781

(22) Filed: Jan. 19, 2015

(65) Prior Publication Data

US 2016/0315207 A1    Oct. 27, 2016

Related U.S. Application Data

(63) Continuation of application No. 12/406,319, filed on Mar. 18, 2009, now Pat. No. 8,940,178.

(51) Int. Cl.
| | |
|---|---|
| *H01L 31/0236* | (2006.01) |
| *H01L 31/0368* | (2006.01) |
| *H01L 21/306* | (2006.01) |
| *B44C 1/22* | (2006.01) |
| *C09K 13/08* | (2006.01) |
| *H01L 31/18* | (2006.01) |

(52) U.S. Cl.
CPC ........ *H01L 31/02363* (2013.01); *C09K 13/08* (2013.01); *H01L 31/0236* (2013.01); *H01L 31/03682* (2013.01); *H01L 31/182* (2013.01); *Y02E 10/50* (2013.01); *Y10T 428/24479* (2015.01)

(58) Field of Classification Search
None
See application file for complete search history.

(56) References Cited

U.S. PATENT DOCUMENTS

| | | | |
|---|---|---|---|
| 5,518,966 A | 5/1996 | Woo | |
| 5,587,046 A | 12/1996 | Stadler et al. | |
| 5,669,980 A | 9/1997 | McNeil et al. | |
| 5,824,601 A | 10/1998 | Dao et al. | |

(Continued)

FOREIGN PATENT DOCUMENTS

| | | |
|---|---|---|
| DE | 10051052 | 4/2002 |
| JP | 2007332449 | 12/2007 |
| KR | 2008024818 | 3/2008 |

OTHER PUBLICATIONS

Park, Jin-Goo et al., "Effects of Drying Methods and Wettability of Silicon on the Formation of Water Marks in Semiconductor Processing", J. Electrochem. Soc., vol. 142, No. 6, Jun. 1995, 2028-2031.

(Continued)

*Primary Examiner* — Shamim Ahmed

(57) ABSTRACT

A method of texturizing a silicon substrate comprising a) contacting the substrate with an etching solution comprising glycolic acid, b) etching a surface of the substrate thereby forming disruptions in said surface of the substrate, and c) removing the etching solution to yield a texturized substrate, said texturized substrate having a plurality of disruptions in at least one surface with a surface density of disruptions of a minimum of 60 disruptions in a 400 micron square area.

19 Claims, 4 Drawing Sheets

(56) References Cited

U.S. PATENT DOCUMENTS

| | | |
|---|---|---|
| 5,909,742 A | 6/1999 | Ouyang et al. |
| 6,046,117 A | 4/2000 | Bauer et al. |
| 6,146,467 A | 11/2000 | Takaishi et al. |
| 6,156,968 A | 12/2000 | Nishimoto et al. |
| 6,197,611 B1 | 3/2001 | Nishimoto |
| 6,340,640 B1 | 1/2002 | Nishimoto et al. |
| 6,361,712 B1 | 3/2002 | Honda et al. |
| 6,391,145 B1 | 5/2002 | Nishimoto et al. |
| 6,471,880 B1 | 10/2002 | Trouve et al. |
| 6,589,439 B2 | 7/2003 | Honda et al. |
| 6,703,358 B1 | 3/2004 | Aubay et al. |
| 6,875,705 B2 | 4/2005 | Tsai et al. |
| 7,323,421 B2 | 1/2008 | Stinson et al. |
| 7,435,162 B2 | 10/2008 | Kollodge |
| 7,718,590 B2 | 5/2010 | Suzuki et al. |
| 2001/0032829 A1 | 10/2001 | Honda et al. |
| 2002/0127859 A1 | 9/2002 | Wu |
| 2004/0192046 A1 | 9/2004 | Mcfarland et al. |
| 2005/0224459 A1 | 10/2005 | Kezuka et al. |
| 2006/0226122 A1 | 10/2006 | Wojtczak et al. |
| 2007/0080319 A1 | 4/2007 | Fukumura et al. |
| 2007/0128872 A1 | 6/2007 | Itoh et al. |
| 2008/0041823 A1 | 2/2008 | La et al. |
| 2008/0045035 A1 | 2/2008 | Lee et al. |
| 2008/0048279 A1 | 2/2008 | Tsuchiya et al. |
| 2008/0236620 A1 | 10/2008 | Shih et al. |
| 2008/0254625 A1 | 10/2008 | Sharma |
| 2008/0286974 A1 | 11/2008 | Kim et al. |
| 2009/0014796 A1 | 1/2009 | Liaw |

OTHER PUBLICATIONS

DuPont Glyclean eGA, Product brochure, Aug. 2006.
"Photovoltaic solutions headline DuPont showcase at World future Energy Summit", Business Intelligence Middle East, Jan. 19, 2009.
Schwartz, B. et al.,"Chemical Etching of Silicon, IV. Etching Technology", J. Electrochem. Soc., vol. 123, No. 12, Dec. 1976, 1903-1909.

TEXTURED SILICON SUBSTRATE AND METHOD

FIELD OF THE INVENTION

The field of invention relates to textured silicon substrates and an etching method to produce the same.

BACKGROUND OF THE INVENTION

Textured silicon substrates are used in the manufacture of photovoltaic and electronic products. Texture etching of polycrystalline silicon, referred herein as mc-silicon or silicon, is a key way of improving photovoltaic cell efficiency by trapping more light energy during photovoltaic cell operation than untextured silicon. A textured silicon surface minimizes light reflectance thus maximizing light absorption by the photovoltaic cell producing more energy. A textured silicon surface consists of minute recesses and projections on the planar level of the silicon surface, and is typically generated by an etching process.

Conventional texturing etch technology consists of treating mc-silicon with an etching solution. Etching solutions can be either caustic solution or acidic solutions. Caustic etching solutions typically are an aqueous solution containing an alkali earth metal, optionally with an alcohol, and are relatively slow when compared to acidic etching solutions. Acidic etching solutions typically contain a combination of acids, water, and optionally an additive. The concentrations of the acid components can be varied to alter the formation of a pattern of minute recesses and projections on the surface being etched, but such variations can also decrease the uniformity of the light trapping efficiencies of the various portions of the surface.

U.S. Pat. No. 6,340,640 of Nishimoto et al, discloses a method to produce a solar cell using an etch solution containing HF, $HNO_3$, and an agent, wherein said agent contains at least one carboxylic acid with a molecular weight higher than acetic acid, or a mixture of phosphoric acid and a carboxylic acid with a molecular weight higher than acetic acid, to provide projections and recesses on a surface of the silicon wafer of a solar cell. The carboxylic acid is at least one of propionic acid, butyric acid, valoric acid, caproic acid, tartaric acid, succinic acid, adipic acid, propane-tricarboxylic acid, an isomer of propane-tricarboxylic acid. However, it is known that variations in the quality of the mc-silicon available make it difficult to realize efficiencies in mass production. The etching solution often needs to be customized to the quality of the mc-silicon available, requiring adjustments in the concentrations of acids used.

It is desirable to have a texturized silicon wafer with an increased number of surface projections and recesses in a continuous pattern of improved uniformity, and an increased surface density of such projections and recesses, while minimizing light reflectance. Also needed is a method to produce such a silicon substrate without decreasing etch rates acceptable to current manufacturing operations. The present invention meets these needs.

SUMMARY OF THE INVENTION

The present invention comprises a method of texturizing a silicon substrate comprising a) contacting the substrate with an etching solution comprising glycolic acid, b) etching a surface of the substrate thereby forming disruptions in said surface of the substrate, and c) removing the etching solution to yield a texturized substrate.

The present invention further comprises a textured silicon substrate comprising a silicon substrate which has a plurality of disruptions in at least one surface created by contacting said silicon substrate with an acidic etching solution containing glycolic acid.

BRIEF DESCRIPTION OF THE FIGURES

FIG. 1A represents a texturized silicon surface of the present invention prepared using an etching solution containing glycolic acid. FIG. 1D represents a silicon surface texturized using an etching solution containing acetic acid as the additional acid, FIG. 1E represents a silicon surface texturized using an etching solution containing maleic acid as the additional acid, and FIG. 1F represents a silicon surface texturized using an etching solution containing phosphoric acid as the additional acid.

DETAILED DESCRIPTION OF THE INVENTION

Figure 1A:
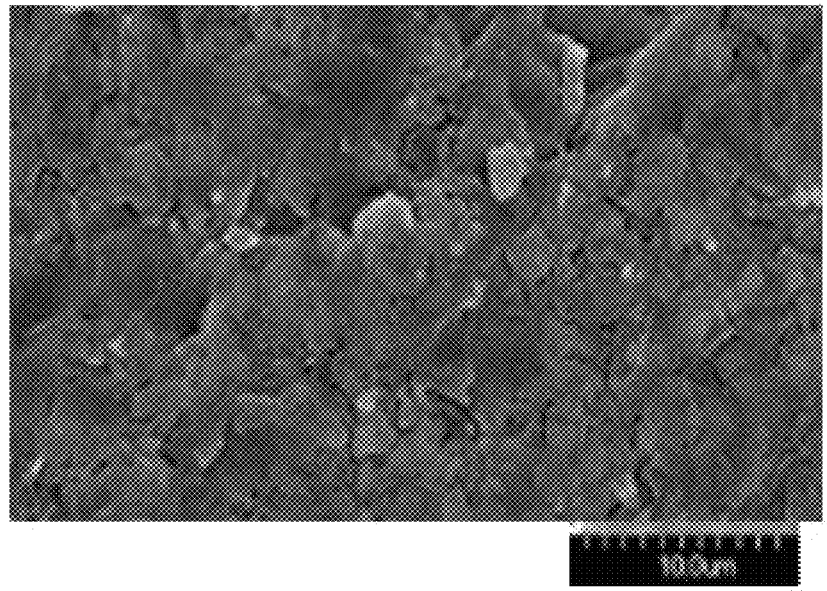
FIG. 1A is a photomicrograph (at 3,000 times magnification) of various silicon surfaces.
Figure 1B:
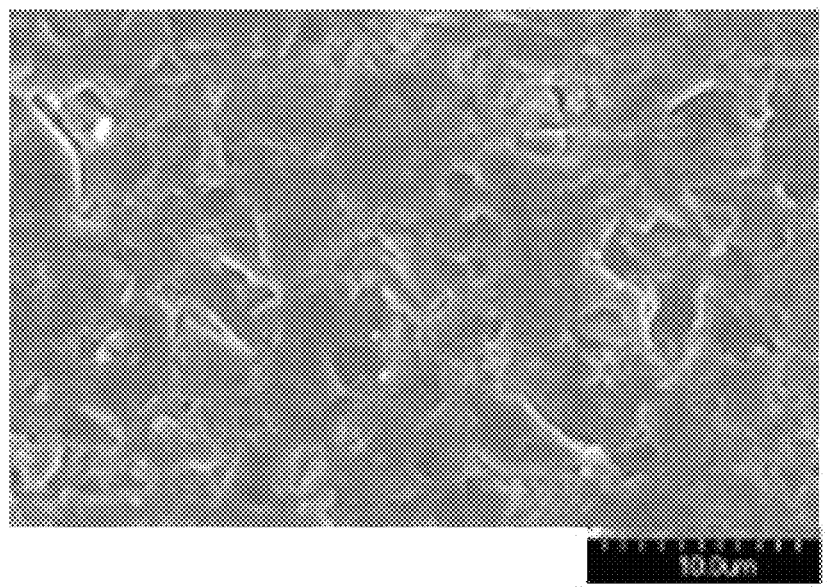
FIG. 1B represents a silicon surface which has not been texturized.
Figure 1C:
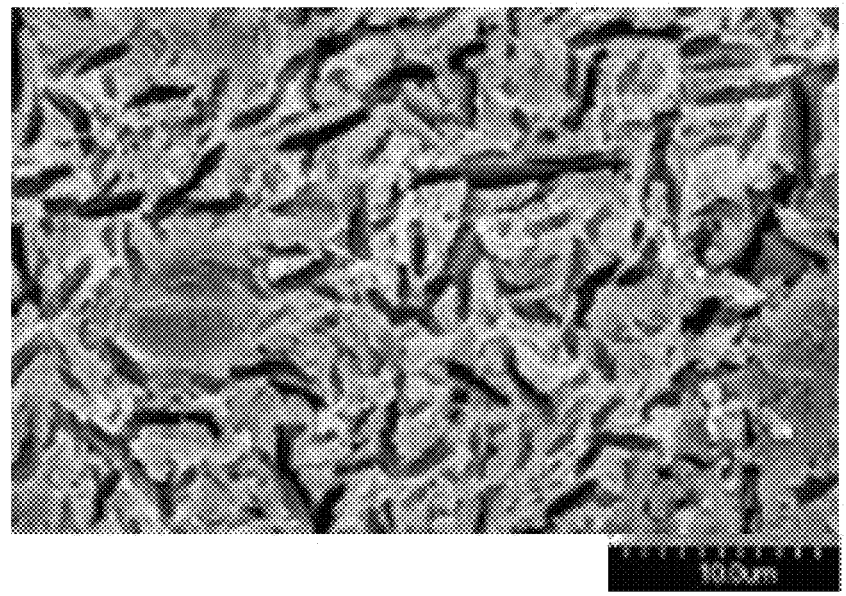
FIG. 1C represents a silicon surface texturized with an etching solution of hydrofluoric acid, nitric acid, and water.
Figure 1D:
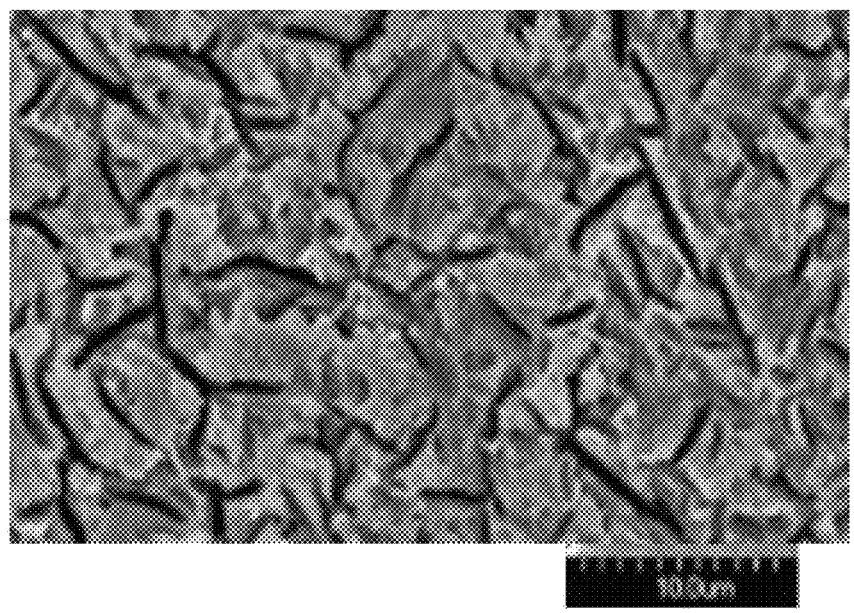
FIGS. 1D through 1F represent silicon surfaces which have been texturized using an etching solution containing hydrofluoric acid, nitric acid, water, and an additional acid.
Figure 1E:
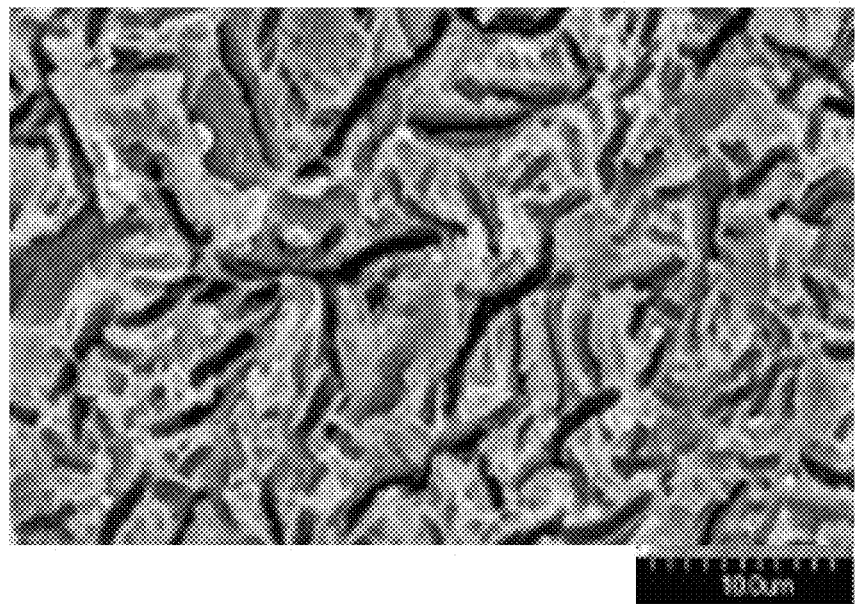
Figure 1F:
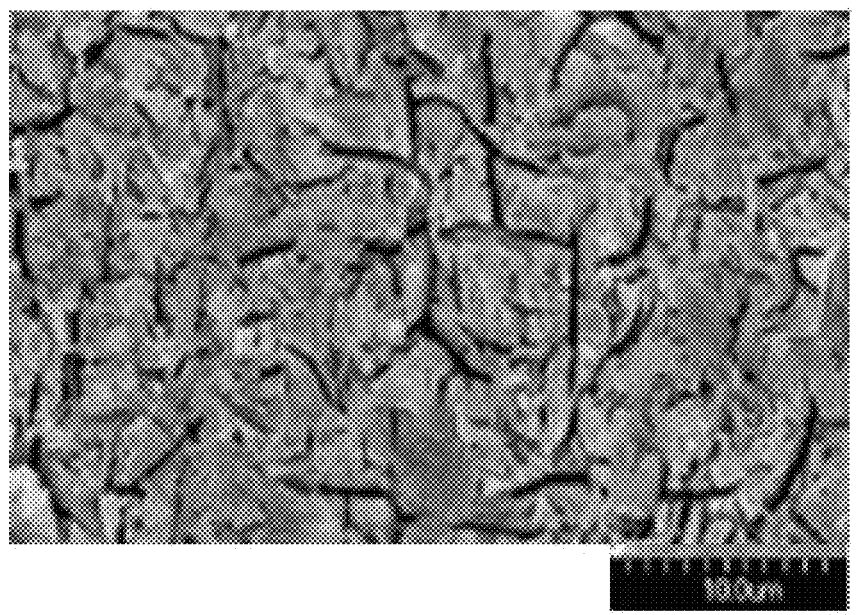

Herein all trademarks are designated with capital letters.

All patents cited herein are hereby incorporated by reference.

"Silicon" as used herein means multicrystalline silicon, also denoted as mc-silicon.

"Textured" or "texturized" means the presence of a plurality of minute inclined planes in a surface due to the presence of disruptions so that the surface is uneven.

"Disruptions" means minute projections and recesses in a plane of a surface.

The present invention comprises a method of texturizing a silicon substrate comprising a) contacting the substrate with an etching solution comprising glycolic acid, b) etching a surface of the substrate thereby forming disruptions in said surface of the substrate, and c) removing the etching solution to yield said texturized substrate. The etching solution used in said method further comprises one or more of hydrofluoric acid, nitric acid, water, and surfactant. The etching solution contains a minimum of 5% by weight of glycolic acid, preferably from about 5% to about 40% by weight glycolic acid.

The present invention further comprises a textured silicon substrate comprising a silicon substrate which has a plurality of disruptions in at least one surface created by contacting said silicon substrate with an etching solution containing glycolic acid. The disruptions are dispersed in a continuous pattern having minimal variations. The surface density of the disruptions is a minimum of 60 disruptions in a 400 square micron surface area. Preferably the surface density of the disruptions is a minimum of 80 disruptions in a 400 square micron surface area, more preferable a minimum of 100 disruptions in a 400 square micron surface area.

Silicon substrates used in the method of the present invention can be produced by methods known to those skilled in the art, and are commonly made from crystalline silicon, preferably multicrystalline silicon. Silicon ingots are formed by cooling molten silicon in a form and cutting into substrates having a thickness of several hundred micrometers. The cutting is typically performed by a wire cutter and results in a rough surface on the silicon face. The uniformity and smoothness of the cut surface varies, thus causing variation in the quality of available silicon substrates. The silicon ingot is then texturized.

The textured silicon substrate of the present invention minimizes light reflectance. By light reflectance, it is meant that light is scattered or reflected away from the substrate at the surface, and not adsorbed into the textured silicon substrate. For photovoltaic cells, a low light reflectance, preferably at low wavelength, such as, for example 300 to 900 nm, is needed for maximum cell efficiency. Increased surface disruptions decrease light reflectance. The textured silicon substrate of the present invention contains a maximum light reflectance of about 30% at wavelengths of from about 300 to about 900 nm. Preferably the maximum wavelength is about 20%, more preferably about 15%, and more preferably about 12% at these wavelengths of from about 300 to about 900 nm.

The textured silicon substrate of the present invention contains a plurality of disruptions on at least one planar surface. The pattern of disruptions affects light reflectance and photovoltaic performance. Variations of the magnitude, height, and spacing of the disruptions will decrease the light absorbance. Thus it is desirable to minimize the variations by increasing the uniformity of the pattern. A continuous pattern of disruptions provides maximum light absorbance. The textured silicon substrate of this invention contains a plurality of disruptions dispersed in a continuous pattern having minimal variations.

The textured silicon substrates of the present invention can be of various sizes, thicknesses and shapes. The textured silicon substrates can be a wafer or cut into rectangles or squares. The thickness of the substrates can vary for specific uses and is limited to the precision of cutting instrumentation. The texture silicon substrate of this invention preferably is in the form of a wafer or a thin film having a thickness of at least 2 micrometers, preferably at least 3 micrometers, more preferably at least 5 micrometers.

The textured silicon substrates of the present invention are useful as semiconductor substrates. These semiconductor substrates can be used, for example, in electronic devices, integrated circuit boards, and photovoltaic cells. For photovoltaic cells, the increase in light adsorption of the silicon substrate after texturizing results in higher energy conversion. Maximum light absorbance, specifically at the lower wavelengths, such as for example 300 to 900 nm, results in high energy outputs. The textured silicon substrate of this invention is preferably in the form of a semiconductor substrate for use in photovoltaic cells.

To produce a textured silicon substrate of this invention, the present invention further comprises a method of texturizing a silicon substrate comprising a) contacting the substrate with an etching solution comprising glycolic acid, b) etching a surface of the substrate thereby forming disruptions in said surface of the substrate, and c) removing the etching solution to yield said texture silicon substrate.

The etching solution used in the method of the present invention is made by physically combining glycolic acid, hydrofluoric acid, nitric acid, with water, and optionally a surfactant. Order of addition of the acids is not critical, but, for safety, the acids should be added to the water. Commercially available acids are suitable for use in the etching solutions used in the present invention. Typical concentrations of commercially available acids in aqueous solution suitable for use in the present invention are as follows: hydrofluoric acid at from about 38% to 52% by weight, nitric acid at from about 52% to 70% by weight, and glycolic acid at from about 20% to 80% by weight. Etching solution compositions useful in the method of the present invention contain glycolic acid and vary in the amount of each of the other acids present and the strength of each acid present.

Specific examples of etching solutions useful in the method of the present invention are those containing from about 4% to about 40% by weight of glycolic acid. Preferably glycolic acid is present at from about 5% to about 30% by weight, more preferably at from about 5% to about 20% by weight. The glycolic acid is preferably added to an acid mixture having a ratio of $HF:HNO_3$:water of 7:3:7; of 7:3:5; of 5:5:7; or of 5:5:9. These ratios are based on use of commercially available HF at a concentration of about 49% by weight in aqueous solution, commercially available $HNO_3$ at a concentration of about 70% by weight in aqueous solution, and commercially available glycolic acid at a concentration of about 70% by weight in aqueous solution.

These commercially available concentrations of acids are used as components in the following preferred embodiments. Examples of preferred embodiments include use of the following specific etching solutions (components are listed below as percent by weight of the etching solution) in the method of the present invention: 1) the etching solution comprises from about 37.4% to about 39.2% hydrofluoric acid, from about 16.0% to about 16.8% nitric acid, from about 37.4% to about 39.2% water, and from about 4.8% to about 9.2% by weight glycolic acid; 2) the etching solution comprises from about 38.9% to about 42.4% hydrofluoric acid, from about 16.7% to about 18.2 nitric acid, from about 27.8% to about 30.3% water, and from about 9.1% to about 16.7% by weight glycolic acid; 3) the etching solution comprises from about 21.0% to about 26.7% hydrofluoric acid, from about 21.0% to about 26.7% nitric acid, from about 29.4% to about 37.4% water, and from about 9.1% to about 28.6% by weight glycolic acid; and 4) the etching solution comprises from about 23.9% to about 25.1% hydrofluoric acid, from about 23.9% to about 25.1% nitric acid, from about 42.1% to about 45.1% water, and from about 4.8% to about 9.1% by weight glycolic acid.

Typical surfactants are wetting agents that lower the surface tension of a liquid. Surfactants are commercially available, for example from E. I. du Pont de Nemours and Company, Wilmington, Del., and Stepan Company, Northfiled Ill. Surfactants comprise between 0% and about 5% by weight of the etching solution used in the method of the present invention. Preferred for use in the present invention are non-ionic surfactants. Examples of specific surfactants useful in the method of the present invention include fluorinated ethoxylated non-ionic surfactants. These are commercially available as ZONYL FSO, ZONYL FSN-100, and ZONYL FSO-100 available from E. I. du Pont de Nemours and Company, Wilmington, Del.

In the method of this invention said contacting of the silicon substrate and the etching solution can be carried out by immersing the silicon substrate into the etching solution or by spraying the substrate with the etching solution. Preferably, said contacting is carried out by immersing the substrate into the etching solution, followed by its removal from the solution. The immersion and removal can be accomplished by mechanical means, such as an automated device, wherein said device holds a substrate in place, dips the substrate into an etching solution bath for a set period of time, and removes the substrate from the etching solution. In the method of this invention an etching rate from about 0.6 to about 1.3 micrometers per minute is employed. Preferably the etching rate is kept constant during etching.

The method of this invention further comprises washing the textured silicon substrate surface with water, alcohol, or a basic solution, and drying. The water can be distilled, de-ionized, or untreated, but preferably the water is free from contaminants. A variety of alcohols are suitable for use in the present invention. Preferred are simple alcohols containing six or fewer carbons, such as isopropanol. Typical washing times are 30 to 60 seconds. Drying can be accomplished by any means known to those skilled in the art including, for example, heat drying, air drying, forced-air drying, and fan drying.

The etching of silicon substrates by solutions containing HF and $HNO_3$ proceeds by an oxidation of the surface silicon atoms accompanied by dissolution of the resulting Si—O species. For etching solutions containing a higher concentration of HF, the rate controlling step is the oxidation-reduction reaction. A high concentration of HF produces a surface which is rough and pitted with sharp peaks. For use of etching solutions containing higher levels of $HNO_3$ dissolution of the formed oxide is the rate controlling step and diffusion of the complexing fluoride species is the important factor. A high concentration of $HNO_3$ produces a smoother surface with more rounded peaks. Thus the relative concentration of the acids in the etching solution affect the morphology of the texturized surface obtained. Additional components in the etching solution affect this system. Further the quality of the unetched silicon varies in that the cutting process and equipment used affect the silicon surface used as a starting material in the etching process. Thus there is a need to determine what particular etching solution composition will work best with the available silicon causing inefficiencies in manufacturing operations.

While not wishing to be bound by theory it is believed that use of hydrofluoric acid in the etching solution removes oxide from the surface of the silicon substrate rendering the surface hydrophobic and affecting its wettability. Thus there is a need to balance enhanced wettability with increasing surface roughness. The etching solution needs to improve wettability, which is done through use of a carboxylic acid group to promote uniformity, while also still increasing surface area and roughness, which can be done through use of a hydroxyl group. Because glycolic acid contains the same number of carboxylic and hydroxyl radicals, it is believed this makes it more effective in creating disruptions to promote light trapping efficiency which are more uniform across the morphology of the surface.

Figure 2:
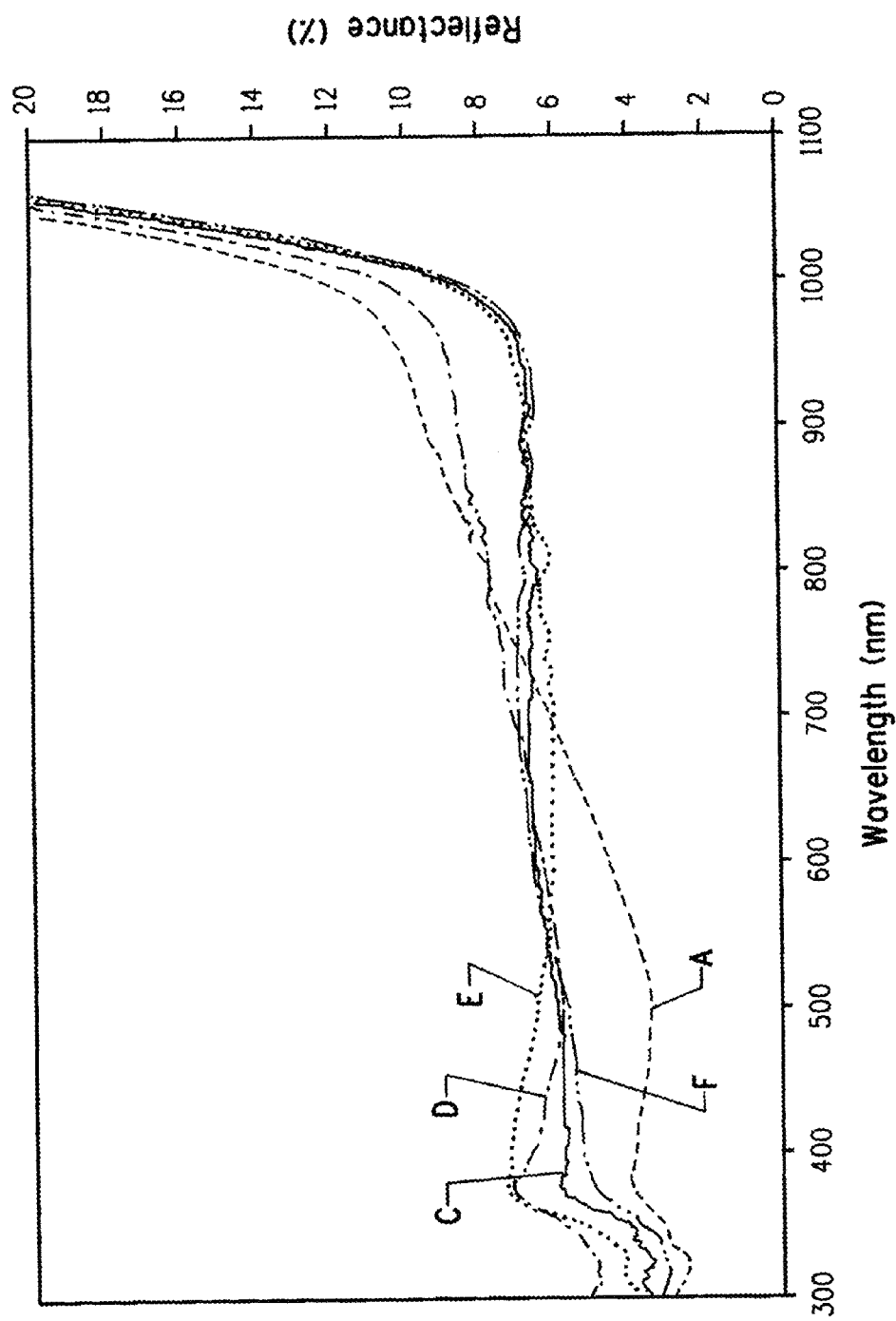
FIG. 2 is a graph of wavelength vs. light reflectance for silicon surfaces as described for FIGS. 1C through 1F.

As can be seen from FIGS. 1 and 2, the use of glycolic acid in the etching solution compared to other acids alters the surface morphology. Large microcracks on the surface of the silicon are removed resulting in more surface uniformity. FIG. 1A of a surface texturized with an etching solution containing glycolic acid shows that the texture of the surface contains more and smaller disruptions while maintaining sufficient roughness to produce a low light reflectance. Comparing FIG. 1A with FIG. 1C (no glycolic acid present), and with FIGS. 1D through 1F (other acids substituted for the glycolic acid) reveals the more uniform morphology provided when the method of the present invention is employed. The surface area in FIG. 1A is altered compared to silicon texturized with other acids in place of the glycolic acid in the etching solution. FIG. 2 provides a graph of wavelength versus reflectance for the etched surfaces shown in FIGS. 1A and 1C through 1F. FIG. 2 shows that use of glycolic acid in the etching solution provides sufficient surface roughness to maintain low reflectance while FIG. 1A shows the greater uniformity of the disruptions on the surface. In FIG. 2 see line A for the solution containing glycolic acid versus lines C (no glycolic present) and D through F (other acids substituted for the glycolic acid). Thus in the present invention uniformity and roughness are balanced. Glycolic acid also provides superior buffering efficiency to the etching solution thus promoting longer performance time before the solution needs to be replaced. In addition, use of glycolic acid provides no residues on the etched surface. Thus use of glycolic acid in etching solutions provides advantages not obtained by use of other acids.

Further a hydrophobic surface is known to be prone to creation of watermarks upon drying. Such watermarks on silicon wafers used in semiconductor processing are undesirable as they are associated with causing electrical failure. Thus by better balancing of wettability and increasing surface roughness, use of glycolic acid in etching solutions provides texturized silicon surfaces more suitable for use in semiconductor processes. The method and texturized silicon substrates of the present invention thus provide advantages in both semiconductor processing and photovoltaic processing.

Materials and Test Methods

The following materials and test methods were used the Examples herein.

All wafers used in the following examples are multicrystalline silicon wafers, commercially available from DC Chemical Co., Ltd., Seoul, South Korea. Following the texturing of each wafer in the examples and comparative examples, the wafers were tested for light reflectance, microscopy.

Scanning electron microscopy, referred herein as microscopy, was used to determine variation in the continuous pattern formed during etching.

Light reflectance spectroscopy was used to determined light trapping efficiency. UV-Vis-NIR spectra were collected on a UV-3101 PC, commercially available from Shimadzu, Kyoto, Japan, and used $BaSO_4$ as a reference.

For preparation of etching solutions, hydrofluoric acid (HF, 49% by weight aqueous solution), nitric acid ($HNO_3$, 70% by weight aqueous solution), and either glycolic acid (70% by weight aqueous solution) or phosphoric acid or maleic acid or acetic acid, were mixed with water at concentrations stated and cooled to 25° C. prior to use.

EXAMPLES

Examples 1 to 4

Etching solutions were prepared by mixing HF (49% in aqueous solution), $HNO_3$ (70% in aqueous solution), and water, in a ratio of 7:3:7 by weight, and adding 5%, 10%, 15%, and 20% by weight glycolic acid, denoted as Examples 1-4 respectively. Compositions of the etch solutions are listed in Table 1 by weight percent of each component in the final solutions. Silicon wafers were etched by immersion into each of the etching solutions for 180 seconds at 25° C. The wafers were removed from the etch solution, rinsed in deionized water, and were dried using forced-air drying. The wafers were tested for light reflectance. Light reflectance results are listed in Table 2. Example 2 was also analyzed using microscopy. FIG. 1 shows the micrograph of Example 2 denoted as area A. FIG. 2 shows the resulting graph of wavelength vs. light reflectance denoted as line A.

Comparative Example A

A silicon wafer, as used in Examples 1-4, was not contacted with any etching solution (untexturized) and was subjected to light reflectance and microscopy. FIG. 1 shows the microscopy denoted as area B. Light reflectance data is shown in Table 2.

Comparative Example B

An etching solution was prepared as in Examples 1 to 4 but no glycolic acid was added. The composition of the etch solution is listed in Table 1 by weight percent of each component in the final solution. A silicon wafer was etched by immersion into the etching solution for 180 seconds at 25° C. The wafer was removed from the etch solution, rinsed in deionized water, and dried using forced-air drying. The wafer was tested for light reflectance and microscopy. Light reflectance results are listed in Table 2. FIG. 1 shows the microscopy denoted as area C.

TABLE 1

| Example | HF | HNO$_3$ | Water | Glycolic Acid |
|---|---|---|---|---|
| | | % by weight | | |
| 1 | 39.2 | 16.8 | 39.2 | 4.8 |
| 2 | 37.4 | 16.0 | 37.4 | 9.1 |
| 3 | 35.8 | 15.3 | 35.8 | 13.0 |
| 4 | 34.3 | 14.7 | 34.3 | 16.7 |
| A | 0.0 | 0.0 | 0.0 | 0.0 |
| B | 41.2 | 17.6 | 41.2 | 0.0 |

TABLE 2

Percent Light Reflectance

| | Wavelength (nm) | | | | | | |
|---|---|---|---|---|---|---|---|
| Example | 900 | 800 | 700 | 600 | 500 | 400 | 300 |
| 1 | 6.204 | 5.469 | 4.977 | 4.697 | 4.526 | 3.816 | 3.223 |
| 2 | 9.607 | 7.884 | 6.279 | 4.684 | 3.638 | 4.059 | 3.038 |
| 3 | 9.831 | 7.468 | 5.83 | 4.146 | 3.43 | 6.419 | 6.699 |
| 4 | 10.67 | 9.375 | 8.136 | 6.473 | 4.55 | 3.227 | 2.98 |
| Comp A | 24.51 | 26.58 | 28.07 | 29.72 | 32.68 | 39.96 | 46.31 |
| Comp B | 6.895 | 6.57 | 6.822 | 6.616 | 6.07 | 5.917 | 3.543 |

Results for Examples 1 though 4 showed a reduction of light reflectance across 300 to 900 nm compared to the un-textured silicon wafer of Comparative Example A. Examples 1 though 4 also showed an overall improvement of light reflectance, specifically across wavelengths 500 nm to 700 nm where the light reflectance percentages were reduced by as much as 3% when compared to Comparative Example B, an etch solution of similar acid strength without glycolic acid.

Examples 5 to 8

Etching solutions were prepared by mixing HF (49% in aqueous solution), HNO$_3$ (70% in aqueous solution), and water, in a ratio of 7:3:5 by weight, and adding 5%, 10%, 15%, and 20% by weight glycolic acid, denoted as Examples 5 to 8 respectively. Compositions of the etch solutions are listed in Table 3 by weight percent of each component in the final solutions. Silicon wafers were etched by immersion into each of the etching solutions for 180 seconds at 25° C. The wafers were removed from the etch solution, rinsed in deionized water, and were dried using forced-air drying. The wafers were tested for light reflectance. Light reflectance results are listed in Table 4.

Comparative Example C

An etching solution was prepared as in Examples 5 to 8 but no glycolic acid was added. The composition of the etch solution is listed in Table 3 by weight percent of each component in the final solution. A silicon wafer was etched by immersion into the etching solution for 180 seconds at 25° C. The wafer was removed from the etch solution, rinsed in deionized water, and dried using forced-air drying. The wafer was tested for light reflectance. Light reflectance results are listed in Table 4.

TABLE 3

| Example | HF | HNO$_3$ | Water | Glycolic Acid |
|---|---|---|---|---|
| | | % by weight | | |
| 5 | 44.4 | 19.0 | 31.7 | 4.8 |
| 6 | 42.4 | 18.2 | 30.3 | 9.1 |
| 7 | 40.6 | 17.4 | 29.0 | 13.0 |
| 8 | 38.9 | 16.7 | 27.8 | 16.7 |
| Comp C | 46.7 | 20.0 | 33.3 | 0.0 |

TABLE 4

Percent Light Reflectance

| | Wavelength (nm) | | | | | | |
|---|---|---|---|---|---|---|---|
| Example | 900 | 800 | 700 | 600 | 500 | 400 | 300 |
| 5 | 10.48 | 9.981 | 10.4 | 10.96 | 11.53 | 12.47 | 9.425 |
| 6 | 9.676 | 9.764 | 10.3 | 10.47 | 9.947 | 9.79 | 5.673 |
| 7 | 8.597 | 8.263 | 8.199 | 8.481 | 8.597 | 8.192 | 4.201 |
| 8 | 6.918 | 7.011 | 7.123 | 7.533 | 7.773 | 7.567 | 3.195 |
| Comp C | 11.74 | 10.54 | 10.02 | 9.848 | 10.33 | 12.13 | 8.238 |

Results for Examples 5 though 8 showed an overall improvement of light reflectance. Examples 7 and 8, which were etched with etch solutions that contained glycolic acid levels of 13% and 17% by weight of solution, showed greater reduction in light reflectance, specifically across wavelengths 300 nm to 900 nm where the light reflectance percentages were reduced by as much as 5% when compared to Comparative Example C, a wafer etched with an etch solution of similar acid strength without glycolic acid, Examples 9 to 15

Etching solutions were prepared by mixing HF (49% in aqueous solution), $HNO_3$ (70% in aqueous solution), and water, in a ratio of 5:5:7 by weight, and adding 5%, 10%, 15%, 20%, 25%, 30% and 40% by weight glycolic acid, denoted as Examples 9 to 15 respectively. Compositions of the etch solutions are listed in Table 5 by weight percent of each component in the final solutions. Silicon wafers were etched by immersion into each of the etching solutions for 180 seconds at 25° C. The wafers were removed from the etch solution, rinsed in deionized water, and were dried using forced-air drying. The wafers were tested for light reflectance. Light reflectance results are listed in Table 6.

Comparative Example D

An etching solution was prepared as in Examples 9 to 15 but no glycolic acid was added. The composition of the etch solution is listed in Table 5 by weight percent of each component in the final solution. A silicon wafer was etched by immersion into the etching solution for 180 seconds at 25° C. The wafer was removed from the etch solution, rinsed in deionized water, and dried using forced-air drying. The wafer was tested for light reflectance. Light reflectance results are listed in Table 6.

Results for Examples 9 though 15 showed an overall improvement of light reflectance. Examples 10 through 15, etched with an etch solution which contained glycolic acid at levels between 5% and 29% by weight of solution, showed greater reduction in light reflectance, specifically across wavelengths 300 nm to 900 nm where the light reflectance percentages were reduced by as much as 6% when compared to Comparative Example D, a wafer etched with an etch solution of similar acid strength without glycolic acid, Examples 16 to 19

Etching solutions were prepared by mixing HF (49% in aqueous solution), $HNO_3$ (70% in aqueous solution), and water, in a ratio of 5:5:9 by weight, and adding 5%, 10%, 15%, and 20% by weight glycolic acid, denoted as Examples 16 to 19 respectively. Compositions of the etch solutions are listed in Table 7 by weight percent of each component in the final solutions. Silicon wafers were etched by immersion into each of the etching solutions for 180 seconds at 25° C. The wafers were removed from the etch solution, rinsed in deionized water, and were dried using forced-air drying. The wafers were tested for light reflectance. Light reflectance results are listed in Table 8.

Comparative Example E

An etching solution was prepared as in Examples 16 to 19 but no glycolic acid was added. The composition of the etch solution is listed in Table 7 by weight percent of each component in the final solution. A silicon wafer was etched by immersion into the etching solution for 180 seconds at 25° C. The wafer was removed from the etch solution, rinsed in deionized water, and dried using forced-air drying. The wafer was tested for light reflectance and microscopy. Light reflectance results are listed in Table 8.

TABLE 5

| Example | HF | $HNO_3$ | Water | Glycolic Acid |
|---|---|---|---|---|
| | % by weight | | | |
| 9 | 28.0 | 28.0 | 39.2 | 4.8 |
| 10 | 26.7 | 26.7 | 37.4 | 9.1 |
| 11 | 25.6 | 25.6 | 35.8 | 13.0 |
| 12 | 24.5 | 24.5 | 34.3 | 16.7 |
| 13 | 23.5 | 23.5 | 32.9 | 20.0 |
| 14 | 22.6 | 22.6 | 31.7 | 23.1 |
| 15 | 21.0 | 21.0 | 29.4 | 28.6 |
| Comp D | 29.4 | 29.4 | 41.2 | 0.0 |

TABLE 7

| Example | HF | HNO3 | Water | Glycolic Acid |
|---|---|---|---|---|
| | % by weight | | | |
| 16 | 25.1 | 25.1 | 45.1 | 4.8 |
| 17 | 23.9 | 23.9 | 43.1 | 9.1 |
| 18 | 22.9 | 22.9 | 41.2 | 13.0 |
| 19 | 21.9 | 21.9 | 39.5 | 16.7 |
| Comp E | 26.3 | 26.3 | 47.4 | 0.0 |

TABLE 6

Percent Light Reflectance

| | Wavelength (nm) | | | | | | |
|---|---|---|---|---|---|---|---|
| Example | 900 | 800 | 700 | 600 | 500 | 400 | 300 |
| 9 | 11.050 | 10.340 | 10.110 | 10.480 | 11.560 | 13.78 | 8.072 |
| 10 | 7.863 | 7.404 | 7.718 | 7.646 | 6.944 | 6.084 | 2.559 |
| 11 | 6.476 | 6.027 | 6.059 | 6.042 | 5.814 | 5.064 | 2.417 |
| 12 | 7.458 | 7.034 | 6.535 | 6.435 | 6.947 | 7.73 | 2.484 |
| 13 | 4.878 | 4.964 | 5.295 | 5.064 | 4.105 | 3.398 | 2.336 |
| 14 | 5.879 | 5.217 | 4.820 | 4.652 | 4.601 | 3.972 | 2.591 |
| 15 | 9.102 | 7.356 | 6.024 | 5.113 | 4.903 | 5.164 | 2.78 |
| Comp D | 11.930 | 9.517 | 9.685 | 9.576 | 9.717 | 10.56 | 6.557 |

TABLE 8

Percent Light Reflectance

| | Wavelength (nm) | | | | | | |
|---|---|---|---|---|---|---|---|
| Example | 900 | 800 | 700 | 600 | 500 | 400 | 300 |
| 16 | 5.782 | 5.309 | 4.913 | 4.745 | 4.445 | 3.97 | 2.571 |
| 17 | 6.219 | 6.020 | 5.896 | 5.862 | 5.910 | 4.991 | 2.721 |
| 18 | 6.435 | 5.528 | 5.016 | 4.552 | 4.321 | 3.54 | 3.062 |
| 19 | 7.967 | 6.389 | 5.319 | 4.507 | 4.694 | 5.191 | 2.988 |
| Comp E | 6.320 | 6.445 | 6.079 | 6.102 | 6.113 | 5.882 | 2.885 |

Results for Examples 16 though 19 showed an overall improvement of light reflectance compared to Comparative Example E containing no glycolic acid. Examples 16 through 19, wafers etched with an etch solution which contained glycolic acid levels between 6 and 18% by weight of solution, showed greater reduction in light reflectance, specifically across wavelengths 300 nm to 900 nm where the light reflectance percentages were reduced by as much as 2% when compared to Comparative Example E, a wafer etched with an etch solution of similar acid strength without glycolic acid.

Comparative Example F

An etching solution was prepared by mixing HF (49% in aqueous solution), $HNO_3$ (70% in aqueous solution), water, and acetic acid (99.7% in aqueous solution) in a ratio of 7:3:7:1 by weight. The composition of the etch solution is listed in Table 9 by weight percent of each component in the final solution. A silicon wafer was etched by immersion into the etching solution for 180 seconds at 25° C. The wafer was removed from the etch solution, rinsed in deionized water, and were dried using forced-air drying. The wafer was tested for light reflectance and microscopy. Light reflectance results are listed in Table 10. FIG. 1 shows the micrograph denoted as area D. FIG. 1 shows the resulting graph of wavelength vs. light reflectance denoted as line D.

Comparative Example G

An etching solution was prepared by mixing HF (49% in aqueous solution), $HNO_3$ (70% in aqueous solution), water, and maleic acid (99% in aqueous solution) in a ratio of 7:3:7:1 by weight. The composition of the etch solution is listed in Table 9 by weight percent of each component in the final solution. A silicon wafer was etched by immersion into the etching solution for 180 seconds at 25° C. The wafer was removed from the etch solution, rinsed in deionized water, and were dried using forced-air drying. The wafer was tested for light reflectance and microscopy. Light reflectance results are listed in Table 10. FIG. 1 shows the micrograph denoted as area E. FIG. 1 shows the resulting graph of wavelength vs. light reflectance denoted as line E.

Comparative Example H

An etching solution was prepared by mixing HF (49% in aqueous solution), $HNO_3$ (70% in aqueous solution), water, and phosphoric acid (85% in aqueous solution) in a ratio of 7:3:7:1 by weight. The composition of the etch solution is listed in Table 9 by weight percent of each component in the final solution. A silicon wafer was etched by immersion into the etching solution for 180 seconds at 25° C. The wafer was removed from the etch solution, rinsed in deionized water, and were dried using forced-air drying. The wafer was tested for light reflectance and microscopy. Light reflectance results are listed in Table 10. FIG. 1 shows the micrograph denoted as area F. FIG. 1 shows the resulting graph of wavelength vs. light reflectance denoted as line F.

TABLE 9

| Example | HF | HNO3 | Water | Acid | Acid Used |
|---|---|---|---|---|---|
| | | % by weight | | | |
| 2 | 37.4 | 16.0 | 37.4 | 9.1 | Glycolic Acid |
| Comp A | 0 | 0 | 0 | 0 | none |
| Comp B | 41.2 | 17.6 | 41.2 | 0.0 | none |
| Comp F | 23.9 | 23.9 | 43.1 | 9.1 | Phosphoric Acid |
| Comp G | 23.9 | 23.9 | 43.1 | 9.1 | Acetic Acid |
| Comp H | 23.9 | 23.9 | 43.1 | 9.1 | Maleic Acid |

TABLE 10

Percent Light Reflectance

| | Wavelength (nm) | | | | | | |
|---|---|---|---|---|---|---|---|
| Example | 900 | 800 | 700 | 600 | 500 | 400 | 300 |
| 2 | 9.607 | 7.884 | 6.279 | 4.684 | 3.638 | 4.059 | 3.038 |
| Comp A | 24.51 | 26.58 | 28.07 | 29.72 | 32.68 | 39.96 | 46.31 |
| Comp B | 6.895 | 6.57 | 6.822 | 6.616 | 6.07 | 5.917 | 3.543 |
| Comp F | 6.799 | 6.989 | 7.126 | 6.792 | 5.928 | 5.417 | 3.304 |
| Comp H | 8.763 | 7.846 | 7.236 | 6.488 | 6.053 | 6.927 | 4.768 |
| Comp G | 6.946 | 6.415 | 6.223 | 6.248 | 6.696 | 7.449 | 3.795 |

Example 2, Comparative Examples A, B, F, H, and G were tested and compared in morphology and light reflectance. Morphology micrographs are illustrated in FIG. 1. Light reflectance data is listed in Table 10 and graphed vs. wavelength in FIG. 2. Example 2 showed an overall reduction of light reflectance, specifically across 300 to 700 nm compared to Comparative Example A (a non-textured silicon wafer), Comparative Example B (a silicon wafer etched with an etch solution of similar acid strength without glycolic acid), and Comparative Examples F, H, and G where different acids were used in place of the glycolic acid.

Results for microscopy and light reflectance showed that Example 2 demonstrated a qualitative change in surface texture, with a high density of very small features of about 100 disruptions in a 400 square micron area and low light reflectance. These are seen in the micrographs in FIG. 1 and the light reflectance data shown in Table 10 and FIG. 2. The disruptions of Example 2 had features significantly smaller than the dimensions from the Comparative Examples B through D, which had typical dimensions of less than 1 micrometer by less than 10 micrometer, with a surface density of approximately 30 disruptions in a 400 square micron area.

Consideration of the results from both tests demonstrated that the textured silicon substrates of this invention and the method of texturing of this invention provided a high surface density of disruptions on the surface and a low light reflectance. This low light reflectance and high surface density equates to an increase in adsorbed light into the silicon substrate. For photovoltaic cell applications, increased light adsorption results in an increase of energy produced.

What is claimed is:

1. A method of texturizing a silicon substrate comprising a) contacting the substrate with an etching solution comprising from about 4% to about 40% by weight glycolic acid, b) etching a surface of the substrate thereby forming disruptions in said surface of the substrate, and c) removing the etching solution to yield a texturized substrate.

2. The method of claim 1 wherein the etching solution further comprises one or more of hydrofluoric acid, nitric acid, water, and surfactant.

3. The method of claim 1 wherein the etching solution contains a minimum of 5% by weight of glycolic acid.

4. The method of claim 1 wherein the etching solution contains from about 5% to about 28.6% by weight glycolic acid.

5. The method of claim 1 further comprising washing the texturized substrate surface with water or a basic solution, and drying.

6. The method of claim 1 wherein the contacting is by immersing the substrate into the etching solution or by spraying the etching solution onto the substrate.

7. The method of claim 1 wherein the etching rate is from about 0.6 to about 1.3 micrometers per minute.

8. The method of claim 1 wherein the etching rate is kept constant during etching.

9. The method of claim 1 wherein the etching solution comprises on a weight percent basis from about 37.4% to about 39.2% hydrofluoric acid, from about 16.0% to about 16.8% nitric acid, from about 37.4% to about 39.2% water, and from about 4.8% to about 9.1% glycolic acid.

10. The method of claim 1 wherein the etching solution comprises on a weight percent basis from about 38.9% to about 42.4% hydrofluoric acid, from about 16.7% to about 18.2% nitric acid, from about 27.8% to about 30.3% water, and from about 9.1% to about 16.7% glycolic acid.

11. The method of claim 1 wherein the etching solution comprises on a weight percent basis from about 21.0% to about 26.7% hydrofluoric acid, from about 21.0% to about 26.7% nitric acid, from about 29.4% to about 37.4% water, and from about 9.1% to about 28.6% glycolic acid.

12. The method of claim 1 wherein the etching solution comprises on a weight percent basis from about 23.9% to about 25.1% hydrofluoric acid, from about 23.9% to about 25.1% nitric acid, from about 43.1% to about 45.1% water, and from about 4.8% to about 9.1% glycolic acid.

13. A method of texturizing a silicon substrate comprising a) contacting the substrate with an etching solution comprising about 4% to about 40% by weight glycolic acid, and one or more of hydrofluoric acid, nitric acid, water, and surfactant, b) etching a surface of the substrate thereby forming disruptions in said surface of the substrate, and c) removing the etching solution to yield a texturized substrate.

14. The method of claim 13, wherein the etching solution contains a minimum of about 5% by weight of glycolic acid.

15. The method of claim 13, further comprising washing the texturized substrate surface with water or a basic solution, and drying.

16. The method of claim 13, wherein the contacting is by immersing the substrate into the etching solution or by spraying the etching solution onto the substrate.

17. The method of claim 13, wherein the etching rate is from about 0.6 to about 1.3 micrometers per minute.

18. The method of claim 13, wherein the etching rate is kept constant during etching.

19. The method of claim 2 wherein the etching solution contains from about 5% to about 28.6% by weight glycolic acid.

* * * * *